United States Patent
Hsu et al.

(10) Patent No.: US 11,106,396 B1
(45) Date of Patent: Aug. 31, 2021

(54) MEMORY APPARATUS AND COMPENSATION METHOD FOR COMPUTATION RESULT THEREOF

(71) Applicant: MACRONIX International Co., Ltd., Hsinchu (TW)

(72) Inventors: Po-Kai Hsu, Tainan (TW); Teng-Hao Yeh, Hsinchu County (TW); Ming-Liang Wei, Kaohsiung (TW); Hang-Ting Lue, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/886,251

(22) Filed: May 28, 2020

(51) Int. Cl.
*G11C 11/34* (2006.01)
*G06F 3/06* (2006.01)
*G11C 16/26* (2006.01)
*G11C 16/04* (2006.01)

(52) U.S. Cl.
CPC .......... *G06F 3/0659* (2013.01); *G06F 3/0604* (2013.01); *G06F 3/0673* (2013.01); *G11C 16/26* (2013.01); *G11C 16/0483* (2013.01)

(58) Field of Classification Search
CPC ................ G11C 16/28; G11C 11/5642; G11C 2211/5634; G11C 7/14; G11C 16/10
USPC .......................................... 365/185.2, 185.21
See application file for complete search history.

(56) References Cited

U.S. PATENT DOCUMENTS 9,171,585 B2 * 10/2015 Rajan ....................... G11C 5/06

* cited by examiner

*Primary Examiner* — Son T Dinh
(74) *Attorney, Agent, or Firm* — J.C. Patents

(57) ABSTRACT

A memory apparatus and compensation method for a computation result thereof are provided. The memory apparatus includes a memory sub-block, a reference memory sub-block and a control circuit. During a computation phase, the memory sub-block receives an input signal, and generates a computation result by a multiply-accumulate operation according to the input signal. The reference memory sub-block includes a plurality of memory cells pre-programmed with a reference weight value. The reference memory sub-block receives a reference input signal during a calibration phase, and generates a reference computation value by a multiply-accumulate operation according to the reference input signal and the reference weight value. The control circuit generates an adjustment value according to the reference computation value and a standard computation value, and during the computation phase, adjusts the computation result according to the adjustment value to generate an adjusted computation result.

9 Claims, 5 Drawing Sheets

MEMORY APPARATUS AND COMPENSATION METHOD FOR COMPUTATION RESULT THEREOF

BACKGROUND OF THE INVENTION

1. Field of the Invention

The invention relates to a memory apparatus and a compensation method for computation result thereof, and in particular, to a memory apparatus used for computation in memory (CIM) and a compensation method for computation result thereof.

2. Description of Related Art

Nowadays, as artificial intelligence technology is gradually concerned, a demand for constructing an artificial neural network computing circuit is substantially increased. A computation circuit in memory is proposed to save a circuit area so as to meet the demands of a large number of possible operations.

The computation circuit in memory has a plurality of memory cells, a weight value is programmed for the memory cells, and an input signal is received through a bit line to generate a computation result on a source line by a multiply-accumulate operation according to the input signal and the weigh value. However, in an actual application, the memory cell may generate an electrical change due to various factors, leading to an incorrect computation result, such as a manufacturing process parameter drift during a manufacturing, a temperature change and a voltage change during application, and deterioration of the memory cell.

Referring to a state curve diagram of a memory cell current drift in FIG. 1. A horizontal axis in FIG. 1 is a current of the memory cell, and a vertical axis thereof is a number of the memory cell. An ideal current distribution of the memory cell should be shown by a straight-line IL. Under an influence of the manufacturing process parameter drift, a temperature drift, and/or a voltage drift, the current distribution of the memory cell is shown in a curve CV3. The distribution range expands and a center of the distribution range is offset from the straight-line IL. In the case of deterioration of the memory cell, the current distribution of the memory cell is shown in a curve CV2. The foregoing changes in the current distribution of the memory cell cause an error in the computation result and reduce working efficiency of the computation circuit in memory.

SUMMARY OF THE INVENTION

The invention provides a memory apparatus and a compensation method for a computation result thereof to improve accuracy of a computation result.

A memory apparatus of the invention includes a memory sub-block, a reference memory sub-block, and a control circuit. The memory sub-block is disposed in a memory block. During a computation phase, the memory sub-block is configured to receive an input signal, and generate a computation result by a multiply-accumulate operation according to the input signal. The reference memory sub-block is disposed in the same memory block and includes a plurality of memory cells pre-programmed with a reference weight value. The reference memory sub-block receives a reference input signal during a calibration phase, and generates a reference computation value by a multiply-accumulate operation according to the reference input signal and the reference weight value. The control circuit generates an adjustment value according to the reference computation value and a standard computation value, and during the computation phase, adjusts the computation result according to the adjustment value to generate an adjusted computation result.

The compensation method for a computation result in the invention is adapted for a computation circuit in memory. The compensation method includes: providing a reference memory sub-block and pre-programming a plurality of memory cells of the reference memory sub-block with a reference weight value in; receiving, by the reference memory sub-block, a reference input signal during a calibration phase, and generating a reference computation value by a multiply-accumulate operation according to the reference input signal and the reference weight value; during a computation phase, providing a memory sub-block to receive an input signal and generating a computation result by the multiply-accumulate operation according to the input signal; and providing a control circuit to generate an adjustment value according to the reference computation value and a standard computation value, and during the computation phase, adjusting the computation result according to the adjustment value to generate an adjusted computation result.

Based on the foregoing, the reference memory sub-block is disposed in the memory apparatus of the invention. Through the plurality of memory cells of the reference memory sub-block being pre-programmed with the reference weight value, the reference computation value is generated according to the reference weight value provided by the reference memory sub-block, and then the adjustment value is generated using the reference computation value and the standard computation value. The memory apparatus in the invention is configured to compensate, through the adjustment value, a computation result generated by a general memory sub-block, so that accuracy of the adjusted computation result may be improved.

DESCRIPTION OF THE EMBODIMENTS

Figure 1:
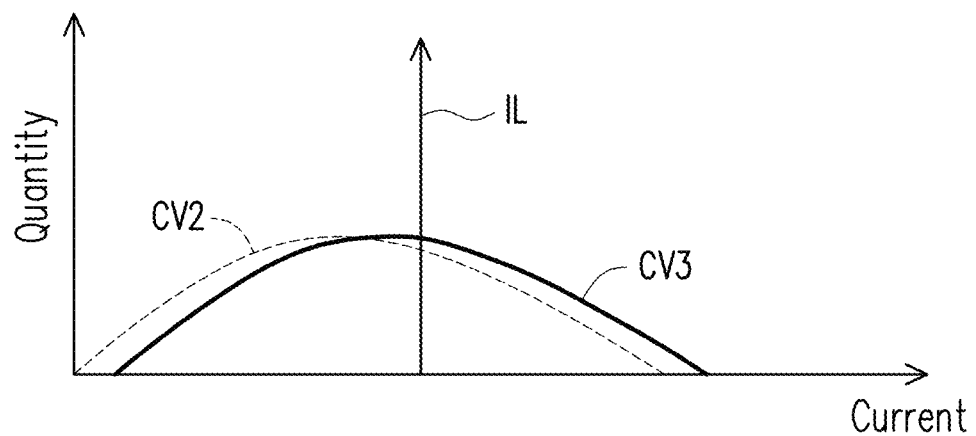
FIG. 1 is a state curve diagram of a memory cell current drift.
Figure 2:
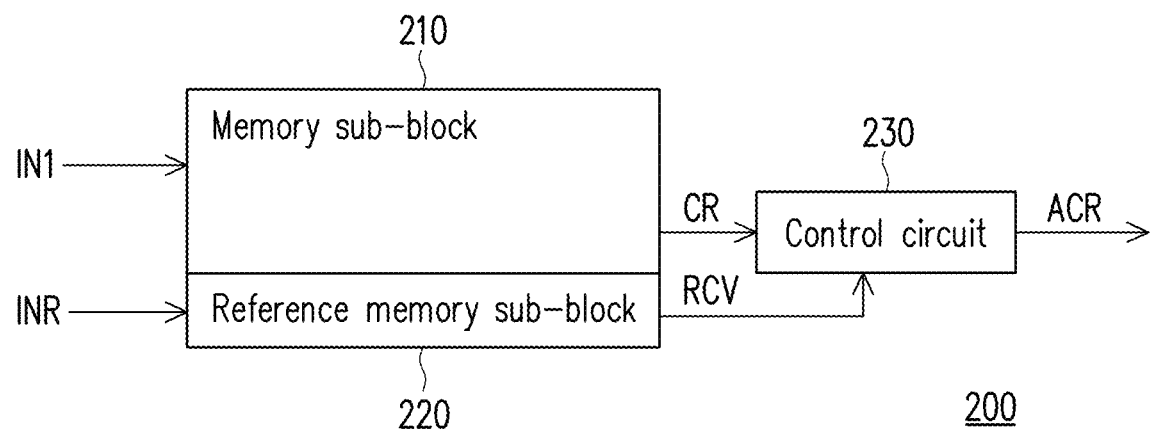
FIG. 2 shows a schematic diagram of a memory apparatus according to an embodiment of the invention.

Referring to FIG. 2, FIG. 2 shows a schematic diagram of a memory apparatus according to an embodiment of the invention. The memory apparatus 200 is configured to perform a computation in the memory. The memory apparatus 200 includes a memory sub-block 210, a reference memory sub-block 220, and a control circuit 230. The memory sub-block 210 and the reference memory sub-block are disposed in a same physical memory block of the memory apparatus 200. The memory sub-block 210 is configured to, during a computation phase, receive an input signal IN1 and generate a computation result CR by a multiply-accumulate operation according to the input signal IN1. Prior to the computation phase, a plurality of memory cells in the memory sub-block 210 may be programmed with a plurality of weight values, these weight values being determined during computation of an artificial neural network. In addition, during the computation phase, the memory cells in the memory sub-block 210 may receive the input signal IN1 through a bit line, and the weight value in the memory cells is multiplied by the correspondingly received input signal IN1 to generate a product, and then the products generated by the plurality of memory cells are added to obtain the computation result CR.

In another aspect, a plurality of memory cells in the reference memory sub-block 220 are pre-programmed with a reference weight value. In the present embodiment, all memory cells in the reference memory sub-block 220 are programmed with a same reference weight value. In addition, during the calibration phase, the reference memory sub-block 220 may receive a reference input signal INR and generate a reference computation value RCV according to the reference input signal INR and the reference weight value. The memory cells in the reference memory sub-block 220 receive a corresponding reference input signal INR through a bit line, and the reference input signal INR is multiplied by the reference weight value provided by the memory cells to obtain a product. In addition, the reference memory sub-block 220 is further configured to add a plurality of products corresponding to a plurality of the memory cells to generate the reference computation value RCV.

In another aspect, a control circuit 230 is coupled to the memory sub-block 210 and the reference memory sub-block 220. During the calibration phase, the control circuit 230 receives the reference computation value RCV generated by the reference memory sub-block 220 and generates an adjustment value according to the reference computation value RCV and the standard computation value. During the computation phase, the control circuit 230 adjusts the computation result CR generated by the memory sub-block 210 according to the adjustment value, and therefore generates an adjusted computation result ACR.

Herein, the standard computation value is a value in an ideal status that may be generated by the reference memory sub-block 220 through a multiply-accumulate operation according to the reference weight value and the reference input signal INR. The standard computation value may be pre-stored in the control circuit 230. The control circuit 230 may cause the standard computation value to be divided by the reference computation value RCV, and generate an adjustment value by computing a ratio of the standard computation value to the reference computation value RCV. In addition, during the computation phase, the control circuit 230 may cause the adjustment value to multiply by the computation result CR so as to obtain the adjusted computation result ACR, and therefore compensate an offset generated by the memory sub-block 210 due to various variables, thereby improving accuracy of the computation in memory.

Incidentally, in an embodiment of the invention, memory cells in the memory sub-block 210 and the reference memory sub-block 220 may be flash memory cells. In the present embodiment, the memory sub-block 210 and the reference memory sub-block 220 may be NAND flash memory sub-blocks, but are not limited thereto. In addition, the memory apparatus 200 may be a memory apparatus that is arranged in a two-dimensional or three-dimensional manner, which is not particularly limited.

It should be noted here, in present embodiment, a number of the memory sub-block 210 also can be plural, and are disposed in a same physical memory block with the reference memory sub-block 220.

Figure 3:
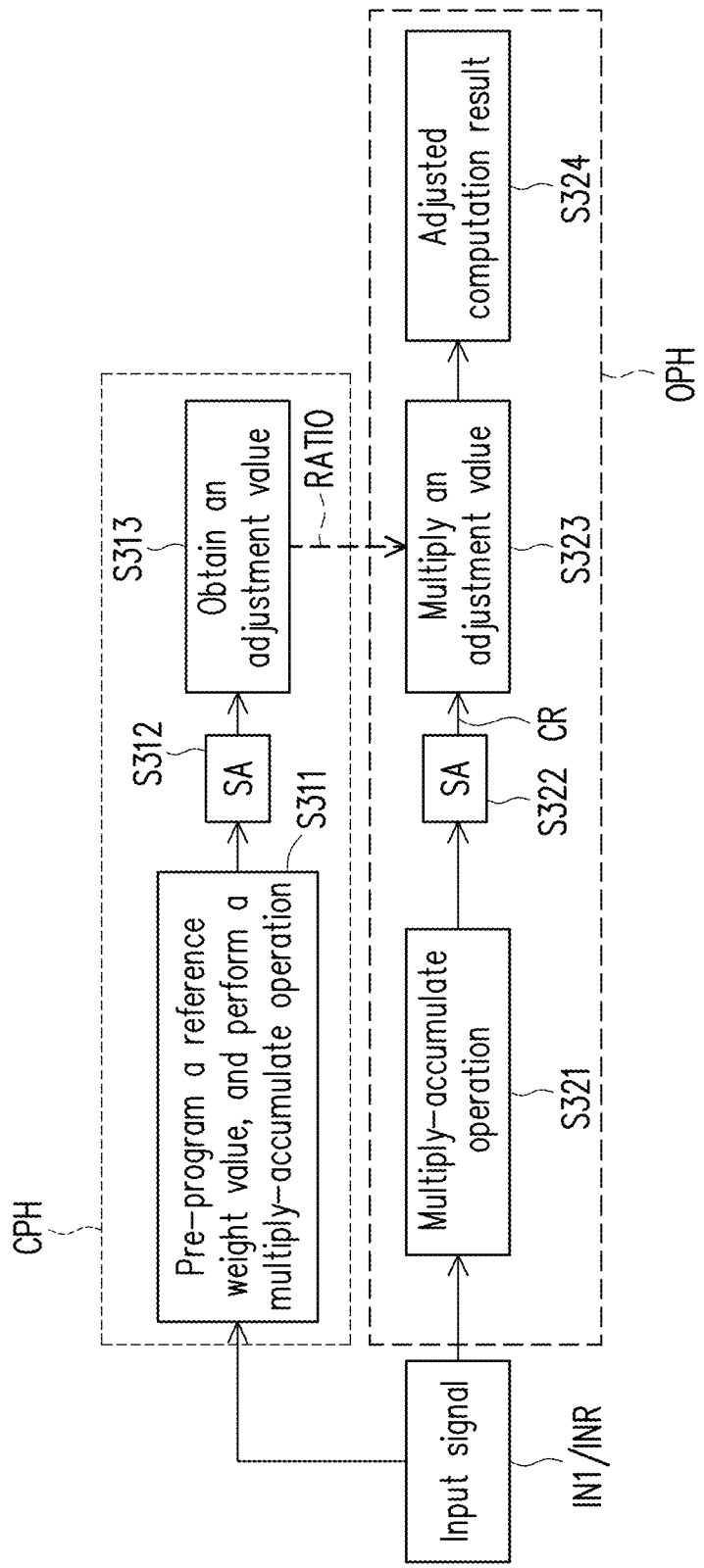
FIG. 3 shows a schematic diagram of an action process of a memory apparatus according to an embodiment of the invention.

Next, referring to FIG. 3, FIG. 3 shows a schematic diagram of an action process of a memory apparatus according to an embodiment of the invention. An input signal used as a reference input signal INR is input into a reference memory sub-block, and a calibration phase CPH is performed. In step S311 of the calibration phase CPH, a memory cell in the reference memory sub-block is pre-programmed with a reference weight value, and a multiply-accumulate operation is performed according to the reference weight value and the reference input signal INR. Next, with a result of the multiply-accumulate operation, a digital reference computation value RCV is generated through a sense amplifier SA (step S312). In addition, in step S313, an adjustment value RATIO is generated by computation of a ratio of the standard computation value to the reference computation value RCV.

Next, a computation phase OPH may be performed. In the computation phase OPH, an input signal IN1 is input into a memory sub-block. In step S321, the memory sub-block performs a multiply-accumulate operation according to the input signal IN1 and the stored weight value. It is worth mentioning that the weight value stored in the memory sub-block may be adjusted according to an artificial neural network operation, and the weight values stored in the memory cells in the memory sub-block may be the same or different, which is not particularly limited.

A computation result generated in step S321 may be provided to a sense amplifier SA to generate a digital computation result CR (step S322). It should be noted herein that the sense amplifiers SA applied in step S322 and step S312 may be a same hardware circuit.

Next, in step S323, the computation result CR may be multiplied by the adjustment value RATIO, and an adjusted computation result ACR may be obtained.

It is worth mentioning that, in the present embodiment, the reference weight value may be set according to a maximum value in a sensing range of the sense amplifier SA. A value of the reference weight value may be set to make the generated reference computation value slightly smaller than the maximum value in the sensing range of the sense amplifier SA, but is not limited thereto.

Figure 4:
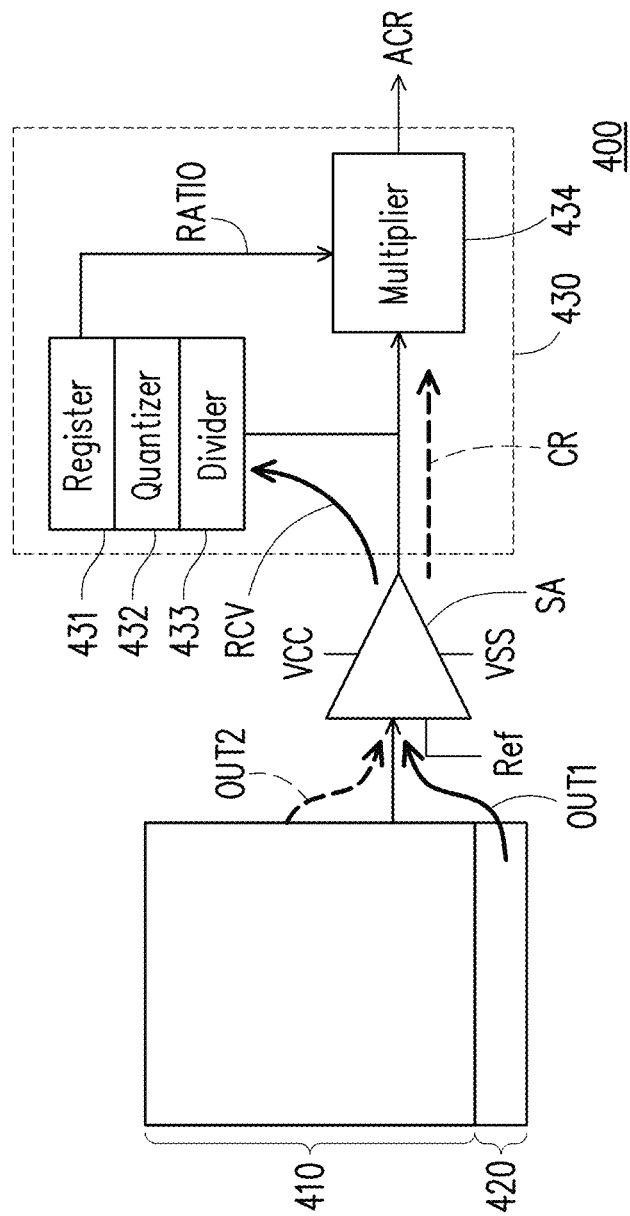
FIG. 4 shows a schematic diagram of a memory apparatus according to another embodiment of the invention.

Referring to FIG. 4 below, FIG. 4 shows a schematic diagram of a memory apparatus according to another embodiment of the invention. The memory apparatus 400 includes one or more memory sub-blocks 410, a reference memory sub-block 420, a sense amplifier SA, and a control circuit 430. The memory sub-blocks 410 and the reference memory sub-block 420 are disposed in a same physical memory block of the memory apparatus 400. The control circuit 430 includes a register 431, a quantizer 432, a divider 433, and a multiplier 434. A memory cell in the reference memory sub-block 420 is pre-programmed with a reference weight value. During a calibration phase, the reference memory sub-block 420 is configured to perform a multiply-accumulate operation according to a received reference input signal and the reference weight value to generate an output value OUT1. The output value OUT1 is transmitted to the sense amplifier SA for sensing, and a reference computation value RCV is generated. A reference computation value RCV1 is transmitted to the control circuit 430. The divider 433 of the control circuit 430 further divides the standard computation value by the reference computation value RCV to generate an adjustment value. In an embodiment of the invention, the control circuit 430 further provides the quantizer 432 to quantize the adjustment value and generate a quantized adjustment value RATIO. The quantized adjustment value RATIO may be stored in the register 431.

In another aspect, during the computation phase, one of the plurality of memory sub-blocks 410 is selected, and a multiply-accumulate operation is performed according to the received input signal and the weight value in the memory sub-block 410 to generate an output value OUT2. The output value OUT2 is transmitted to the sense amplifier SA for sensing, and a computation result CR is generated. The computation result CR is transmitted to the multiplier 434. The multiplier 434 further multiplies the computation result CR by the adjustment value RATIO, and therefore an adjusted computation result ACR is generated.

In the present embodiment, a calibration phase may be periodically generated, and a variation of a working parameter of the memory apparatus 400 and a deterioration status of to memory cell is immediately reflected, and an appropriate adjustment value RATIO is correspondingly generated. Because the memory cells in the reference memory sub-block 420 and the memory sub-block 410 may have a same deterioration trend, in the embodiment of the invention, according to the adjustment value RATIO generated by the reference memory sub-block 420, a deterioration condition of the memory cell may be effectively reflected and a compensation for a computation result is effectively performed.

Incidentally, in the present embodiment, a sense amplifier SA is operated between a power voltage VCC and a ground voltage VSS, and receives a reference signal Ref as a sensing basis. A circuit architecture of the sense amplifier SA may be implemented with any sense amplifier circuit that is well known to those having ordinary knowledge in the art, which not particularly limited. In addition, circuit architectures of the register 431, the quantizer 432, the divider 433, and the multiplier 434 in the embodiment of the invention may be also implemented with a related circuit that is well known to those having ordinary knowledge in the art, which is not particularly limited.

Figure 5:
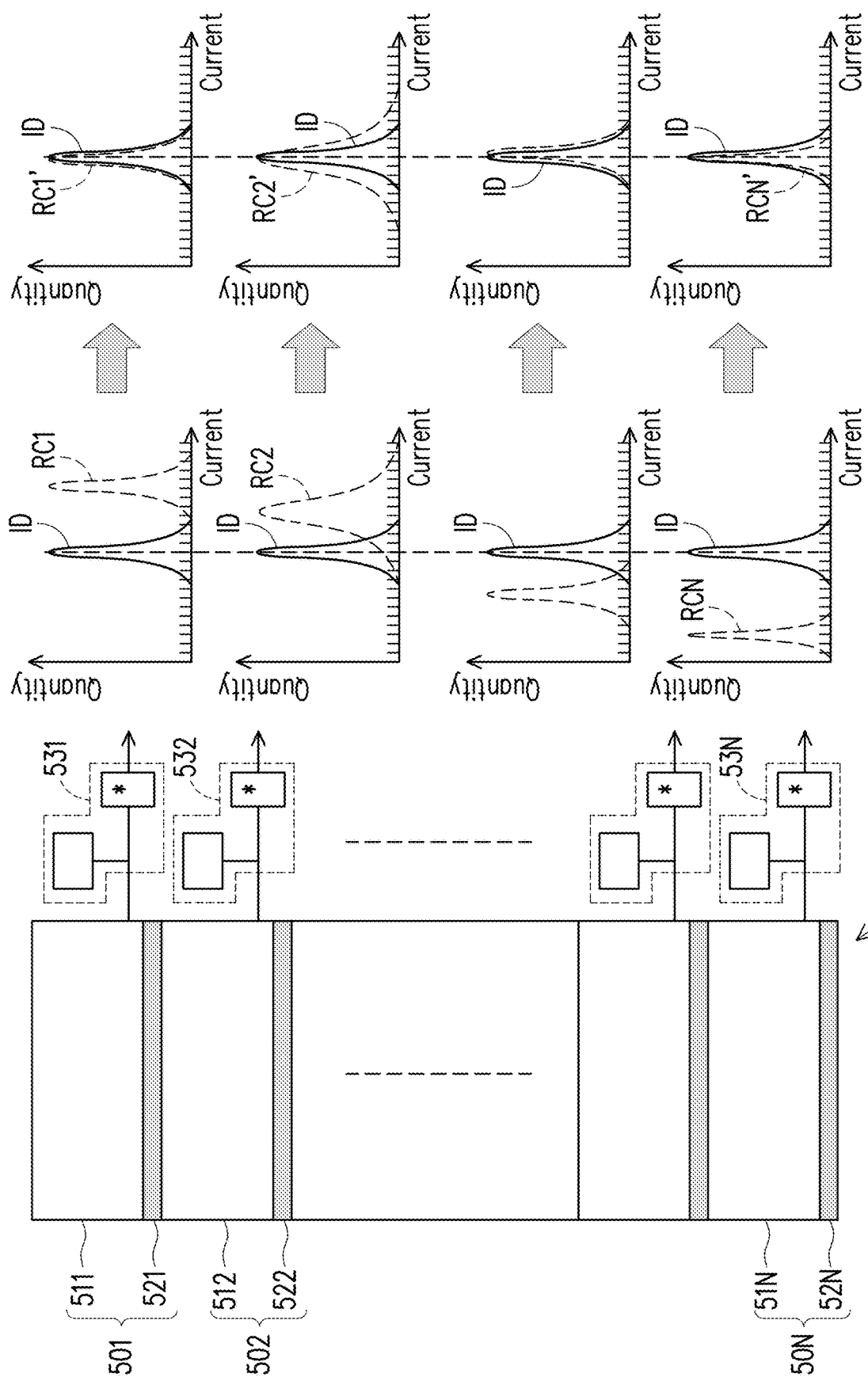
FIG. 5 shows a schematic diagram of a memory apparatus and a current distribution adjustment according to another embodiment of the invention.

Referring to FIG. 5, FIG. 5 shows a schematic diagram of a memory apparatus and a current distribution adjustment according to another embodiment of the invention. A horizontal axis in FIG. 5 is a current of the memory cell, and a vertical axis thereof is a number of the memory cell. A memory apparatus 500 includes a plurality of memory blocks 50-50N, and a plurality of control circuits 531-53N. The memory blocks 50-50N respectively includes a plurality of memory sub-blocks 511-51N, and respectively include a plurality of reference memory sub-blocks 521-52N. The reference memory sub-blocks 521-52N correspond to the memory sub-blocks 511-51N, respectively, and memory cells in the reference memory sub-blocks 521-52N may be pre-programmed with a same reference weight value. The reference memory sub-blocks 521-52N may respectively provide reference computation values to control circuits 531-53N during a calibration phase. In addition, during a computation phase, the control circuits 531-53N respectively adjust computation results generated by the memory sub-blocks 511-51N according to the reference computation values, and a plurality of adjusted computation result are generated.

In the present embodiment, setting may be performed according to a standard computation value, and a same standard current distribution curve ID may be defined for a plurality of memory sub-blocks 511-51N. Under a condition that one or more variables occur, current distribution curves RC1-RCN of the memory sub-blocks 511-51N may not be consistent, but after adjustment of the embodiment of the invention, a center point of a current distribution curve RC1'-RCN' of the adjusted computation result may be aligned with a center point of the standard current distribution curve ID, and uniformity of the computation results generated by a plurality of the memory sub-blocks 511-51N may be improved, and an error tolerance of the memory apparatus 500 may be improved.

Figure 6:
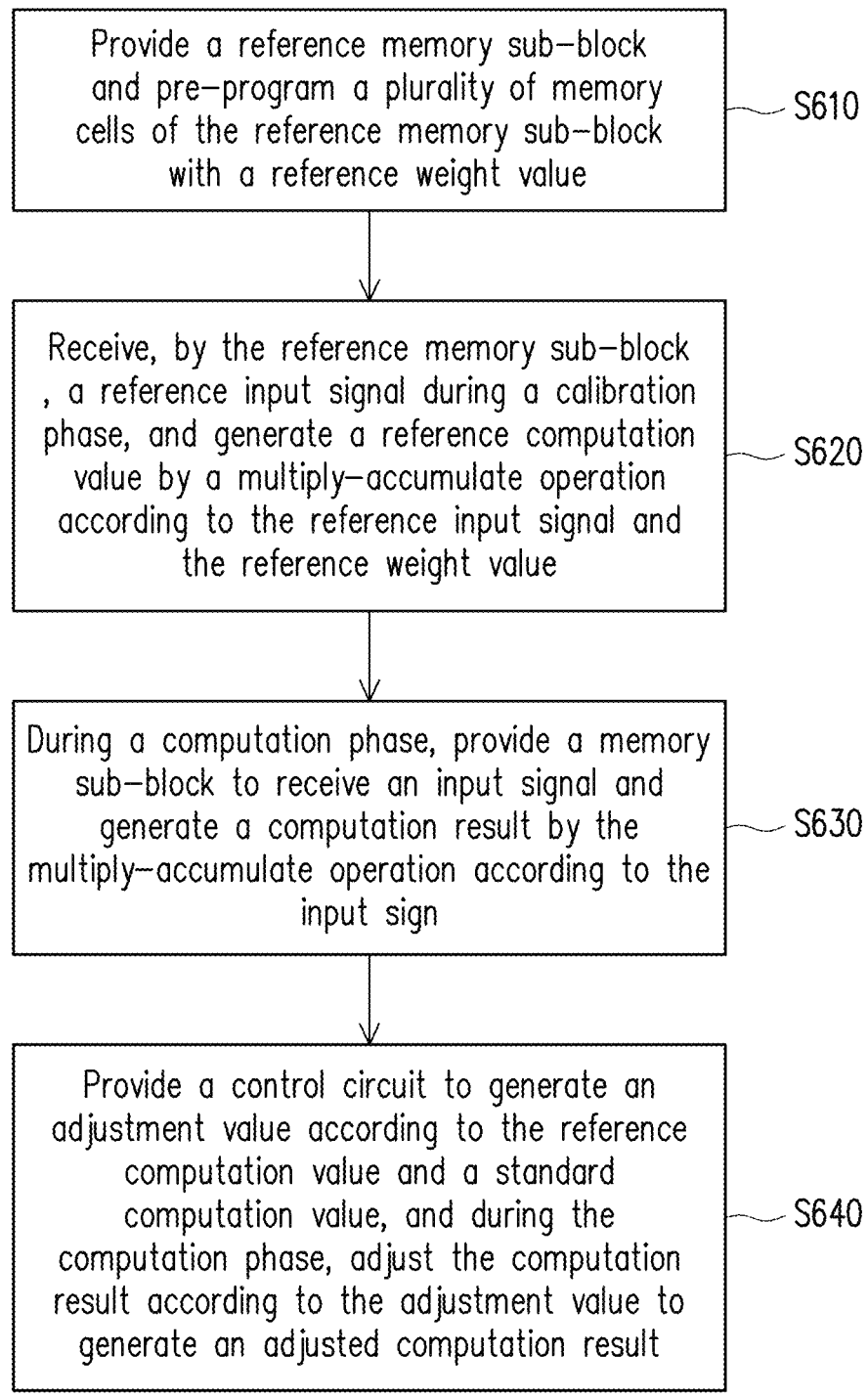
FIG. 6 shows a flowchart of a compensation method for a computation result according to an embodiment of the invention.

Referring to FIG. 6, FIG. 6 shows a flowchart of a compensation method for a computation result according to an embodiment of the invention. The compensation method for a computation result in the present embodiment is adapted for a computation circuit in memory. In the compensation method for a computation result, in step S610, a reference memory sub-block is provided, and a plurality of memory cells of the reference memory sub-block is pre-programmed with a reference weight value. The reference weight values pre-programmed in the plurality of memory cells of the reference memory sub-block may be the same. In step S620, during a calibration phase, the reference memory sub-block receives a reference input signal, and a reference computation value is generated by a multiply-accumulate operation according to the reference input signal and the reference weight value. In addition, in step S630, during a computation phase, a memory sub-block is provided to receive an input signal, and a computation result is generated by a multiply-accumulate operation according to the input signal. In addition, in step S640, a control circuit is provided to generate an adjustment value according to the reference computation value and a standard computation value, and during the computation phase, the computation result is adjusted according to the adjustment value to generate an adjusted computation result.

Details in implementation of the foregoing steps are illustrated in a plurality of the foregoing embodiments, and the descriptions thereof are omitted herein.

To sum up, the reference memory sub-block is disposed in the memory apparatus of the invention. Through the reference weight value being programmed in the reference memory sub-block, the reference computation value generated by the multiply-accumulate operation performed by the reference memory sub-block according to the reference weight value is compared to the preset standard computation value, and therefore the adjustment value is generated. In this way, a computation result generated by a general memory sub-block may be compensated by an adjustment value, and an adjusted computation result with relatively high accuracy may be generated.

What is claimed is:

1. A memory apparatus, comprising:
   a memory sub-block being disposed in a memory block and configured to, during a computation phase, receive an input signal, and generate a computation result by a multiply-accumulate operation according to the input signal;
   a reference memory sub-block being disposed in the memory block and comprising a plurality of memory cells pre-programmed with a reference weight value and configured to receive a reference input signal during a calibration phase and generate a reference computation value by a multiply-accumulate operation according to the reference input signal and the reference weight value; and a control circuit configured to generate an adjustment value according to the reference computation value and a standard computation value, and during the computation phase, adjust the computation result according to the adjustment value to generate an adjusted computation result.

2. The memory apparatus according to claim 1, wherein the control circuit is configured to compute a ratio of the standard computation value to the reference computation value to obtain the adjustment value, and the control circuit causes the adjustment value to multiply by the computation result so as to generate the adjusted computation result.

3. The memory apparatus according to claim 2, wherein the control circuit comprises:
  a divider configured to compute the ratio of the standard computation value to the reference computation value to obtain the adjustment value; and
  a multiplier configured to multiply the adjustment value by the computation result to generate the adjusted computation result.

4. The memory apparatus according to claim 3, wherein the control circuit further comprises:
  a register configured to temporarily store a quantized adjustment value; and
  a quantizer configured to quantize the adjustment value to generate the quantized adjustment value.

5. The memory apparatus according to claim 1, further comprising:
  a sense amplifier configured to sense an output of the reference memory sub-block during the calibration phase to generate the reference computation value and sense an output of the memory sub-block during the computation phase to generate the computation result.

6. The memory apparatus according to claim 5, wherein the reference weight value is set according to a maximum value in a sensing range of the sense amplifier.

7. A compensation method for a computation result adapted for a computation circuit in memory, the method comprising:
  providing a reference memory sub-block and pre-programming a plurality of memory cells of the reference memory sub-block with a reference weight value;
  receiving, by the reference memory, a reference input signal during a calibration phase, and generating a reference computation value by a multiply-accumulate operation according to the reference input signal and the reference weight value;
  during a computation phase, providing a memory sub-block to receive an input signal and generating a computation result by the multiply-accumulate operation according to the input signal; and
  providing a control circuit to generate an adjustment value according to the reference computation value and a standard computation value, and during the computation phase, adjusting the computation result according to the adjustment value to generate an adjusted computation result.

8. The compensation method for a computation result according to claim 7, wherein the step of providing a control circuit to generate an adjustment value according to the reference computation value and a standard computation value, and during the computation phase, adjusting the computation result according to the adjustment value to generate an adjusted computation result comprises:
  computing, by the control circuit, a ratio of the standard computation value to the reference computation value to generate the adjustment value; and
  multiplying, by the control circuit, the adjustment value by the computation result so as to generate the adjusted computation result.

9. The compensation method for a computation result according to claim 7, further comprising: quantizing, by the control circuit, the adjustment value.

* * * * *